United States Patent
Tsao et al.

(10) Patent No.: US 9,735,231 B2
(45) Date of Patent: Aug. 15, 2017

(54) BLOCK LAYER IN THE METAL GATE OF MOS DEVICES

(71) Applicant: Taiwan Semiconductor Manufacturing Company, Ltd., Hsin-Chu (TW)

(72) Inventors: Jung-Chih Tsao, Tainan (TW); Chi-Cheng Hung, Tainan (TW); Yu-Sheng Wang, Tainan (TW); Wen-Hsi Lee, Kaohsiung (TW); Kei-Wei Chen, Tainan (TW); Ying-Lang Wang, Tien-Chung Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 355 days.

(21) Appl. No.: 14/231,099

(22) Filed: Mar. 31, 2014

(65) Prior Publication Data
US 2015/0279838 A1 Oct. 1, 2015

(51) Int. Cl.
*H01L 29/06* (2006.01)
*H01L 21/28* (2006.01)
*H01L 29/49* (2006.01)
*H01L 29/78* (2006.01)
*H01L 29/66* (2006.01)

(52) U.S. Cl.
CPC .... *H01L 29/0653* (2013.01); *H01L 21/28088* (2013.01); *H01L 29/4966* (2013.01); *H01L 29/6656* (2013.01); *H01L 29/66553* (2013.01); *H01L 29/7834* (2013.01);

(Continued)

(58) Field of Classification Search
CPC ................................. H01L 27/14689
See application file for complete search history.

(56) References Cited

U.S. PATENT DOCUMENTS 6,144,099 A * 11/2000 Lopatin ................ H01L 21/288
257/751
2005/0181598 A1* 8/2005 Kailasam .......... H01L 21/76802
438/654

(Continued)

FOREIGN PATENT DOCUMENTS

| TW | 200622042 | 7/2006 |
|----|-----------|--------|
| TW | 200723402 | 6/2007 |
| TW | 201314902 | 4/2013 |

OTHER PUBLICATIONS

Shimizu, Hideharu et al., "CVD and ALD Co(W) Films Using Amidinato Precursors as a Single-Layered Barrier/Liner for Next-Generation Cu-Interconnects," ECS Journal of Solid State Science and Technology, 2(7), pp. 311-315, May 21, 2013.

*Primary Examiner* — Mohammad Choudhry
(74) *Attorney, Agent, or Firm* — Slater Matsil, LLP (57) ABSTRACT

A method includes method includes forming a dummy gate stack over a semiconductor substrate, wherein the semiconductor substrate is comprised in a wafer, removing the dummy gate stack to form a recess, forming a gate dielectric layer in the recess, and forming a metal layer in the recess and over the gate dielectric layer. The metal layer has an n-work function. A block layer is deposited over the metal layer using Atomic Layer Deposition (ALD). The remaining portion of the recess is filled with metallic materials, wherein the metallic materials are overlying the metal layer.

20 Claims, 12 Drawing Sheets

(52) U.S. Cl.
CPC .... *H01L 29/6659* (2013.01); *H01L 29/66545* (2013.01); *H01L 29/66636* (2013.01)

(56) References Cited

U.S. PATENT DOCUMENTS

| | | | |
|---|---|---|---|
| 2010/0081262 A1 | 4/2010 | Lim et al. | |
| 2011/0215409 A1 | 9/2011 | Li et al. | |
| 2012/0052641 A1* | 3/2012 | Lee | H01L 21/28088 438/270 |
| 2012/0228773 A1 | 9/2012 | Brown et al. | |
| 2012/0292720 A1* | 11/2012 | Chen | H01L 29/4983 257/411 |
| 2014/0117463 A1* | 5/2014 | Li | H01L 21/28088 257/410 |
| 2015/0061042 A1* | 3/2015 | Cheng | H01L 29/4966 257/412 |

\* cited by examiner

BLOCK LAYER IN THE METAL GATE OF MOS DEVICES

BACKGROUND

Metal-Oxide-Semiconductor (MOS) devices are basic building elements in integrated circuits. An existing MOS device typically has a gate electrode comprising polysilicon doped with p-type or n-type impurities, using doping operations such as ion implantation or thermal diffusion. The work function of the gate electrode was adjusted to the band-edge of the silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also referred to as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes or metal silicide gate electrodes, wherein the metallic gates used in NMOS devices and PMOS devices may also have band-edge work functions. Since the NMOS devices and PMOS devices have different requirements regarding the work functions, dual-gate CMOS devices are used.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Metal-Oxide-Semiconductor (MOS) device and the method of forming the same are provided in accordance with various exemplary embodiments. The intermediate stages of forming the MOS device are illustrated. The variations of the embodiments are discussed. Throughout the various views and illustrative embodiments, like reference numbers are used to designate like elements.

Figure 1:
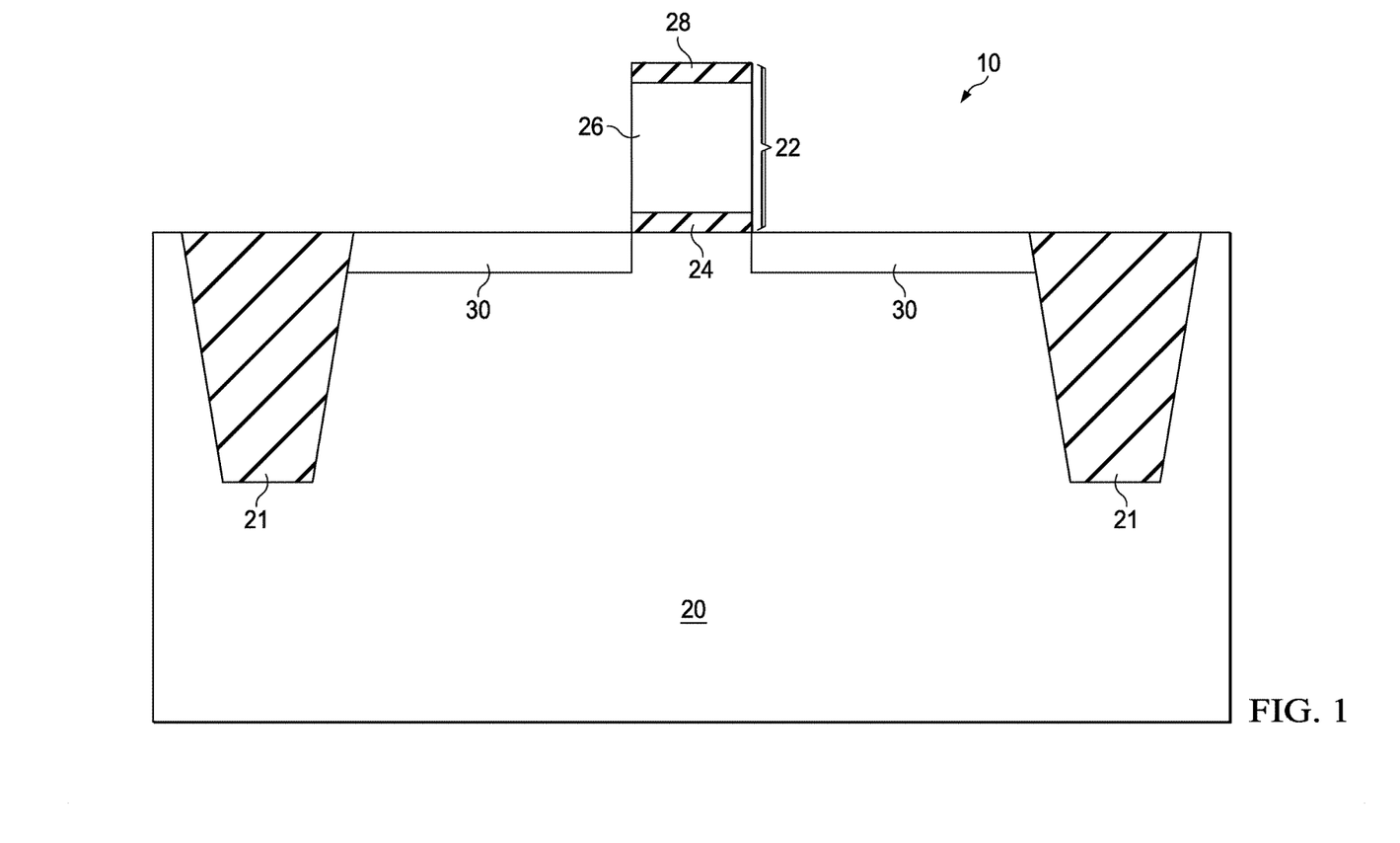
FIGS. 1 through 12 illustrate cross-sectional views of intermediate stages in the formation of a Metal-Oxide-Semiconductor (MOS) device in accordance with some exemplary embodiments.

FIGS. 1 through 12 are cross-sectional views of intermediate stages in the formation of a MOS device in accordance with some exemplary embodiments. Referring to FIG. 1, wafer 10, which comprises substrate 20, is provided. Substrate 20 may be formed of a semiconductor material such as silicon, silicon carbon (SiC), silicon germanium (SiGe), a III-V compound semiconductor, or the like. Isolation regions such as Shallow Trench Isolation (STI) regions 21 are formed in substrate 20, and are used to define the active regions of MOS devices.

Dummy gate stack 22 is formed over substrate 20. Dummy gate stack 22 includes dummy gate dielectric 24 and dummy gate electrode 26. Dummy gate dielectric 24 includes silicon oxide in some exemplary embodiments. In alternative embodiments, other materials such as silicon nitride, silicon carbide, or the like, are also used. Dummy gate electrode 26 may include polysilicon. In some embodiments, dummy gate stacks 22 further includes hard mask 28 over dummy gate electrode 26. Hard mask 28 may comprise silicon nitride, for example, while other materials such as silicon carbide, silicon oxynitride, and the like may also be used. In alternative embodiments, hard mask 28 is not formed.

Figure 10:
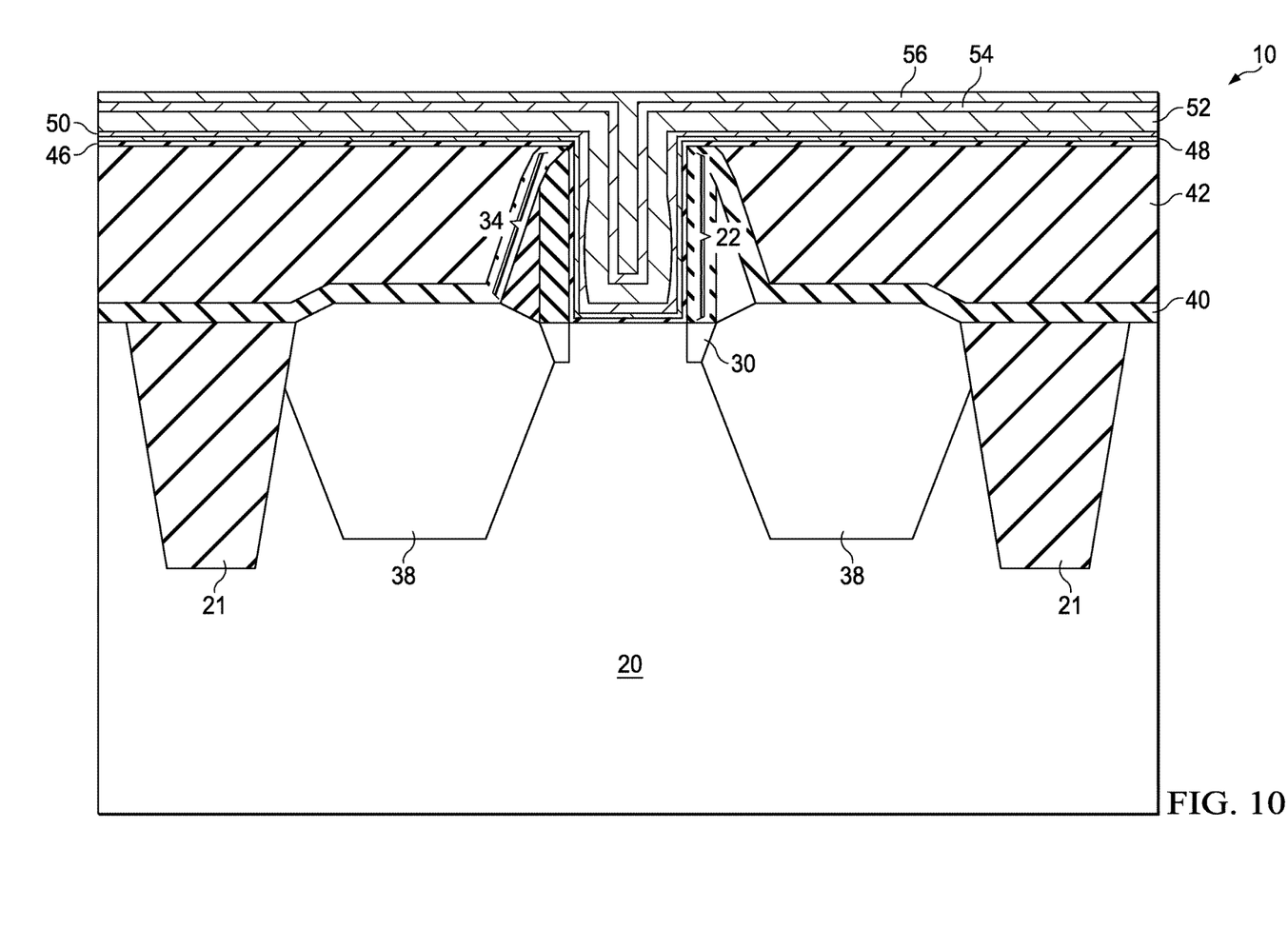

Lightly-Doped Drain/source (LDD) regions 30 are formed, for example, by implanting a p-type impurity (such as boron and/or indium) or an n-type impurity (such as phosphorous and/or arsenic) into substrate 20, depending on the conductivity type of the resulting MOS device 100 (FIG. 10). For example, when MOS device 100 is a pMOS device, LDD regions 30 are p-type regions. When the MOS device 100 is an nMOS device, LDD regions 30 are n-type regions. Dummy gate stacks 22 acts as an implantation mask, so that the edges of LDD regions 30 are substantially aligned with the edges of gate stacks 22.

Figure 2:
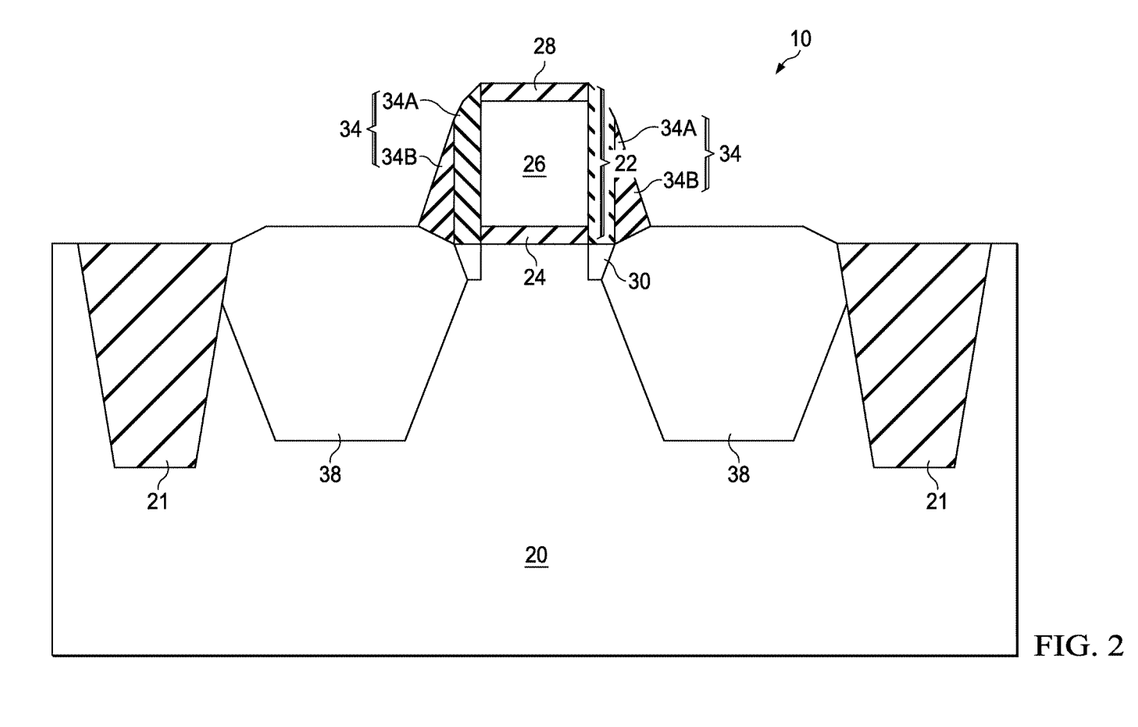

Referring to FIG. 2, gate spacers 34 are formed on the sidewalls of dummy gate stack 22. In some embodiments, each of gate spacers 34 includes silicon oxynitride layer 34A and silicon oxide layer 34B. In alternative embodiments, gate spacers 34 include one or more layers, each comprising silicon oxide, silicon nitride, silicon oxynitride, or other dielectric materials. The available formation methods include Plasma Enhanced Chemical Vapor Deposition (PECVD), Low-Pressure Chemical Vapor Deposition (LP- CVD), Sub-Atmospheric Chemical Vapor Deposition (SACVD), and other deposition methods.

Source and drain regions (referred to as source/drain regions hereinafter) 38 are formed in semiconductor substrate 20. In the embodiments wherein MOS device 100 (FIG. 10) is a pMOS device, source/drain regions 38 are of p-type. In the embodiments wherein MOS device 100 is an nMOS device, source/drain regions 38 are of n-type. In some embodiments, source/drain stressors (also marked as 38) are formed in semiconductor substrate 20. The source/drain stressors form at least parts of source and drain regions 38. FIG. 2 illustrates the embodiments in which source/drain regions 38 fully overlap the respective source/drain stressors. In alternative embodiments, source/drain regions 38 and the source/drain stressors are partially overlapped.

Furthermore, in the embodiments in which MOS device 100 (FIG. 10) is an nMOS device, source/drain stressors 38 may comprise silicon phosphorous (SiP), silicon carbon (SiC), or the like. In the embodiments in which MOS device 100 is a pMOS device, source/drain stressors 38 may comprise silicon germanium (SiGe). The formation of source/drain stressors 38 may be achieved by etching semiconductor substrate 20 to form recesses therein, and then performing an epitaxy to grow source/drain stressors 38 in the recesses.

Figure 3:
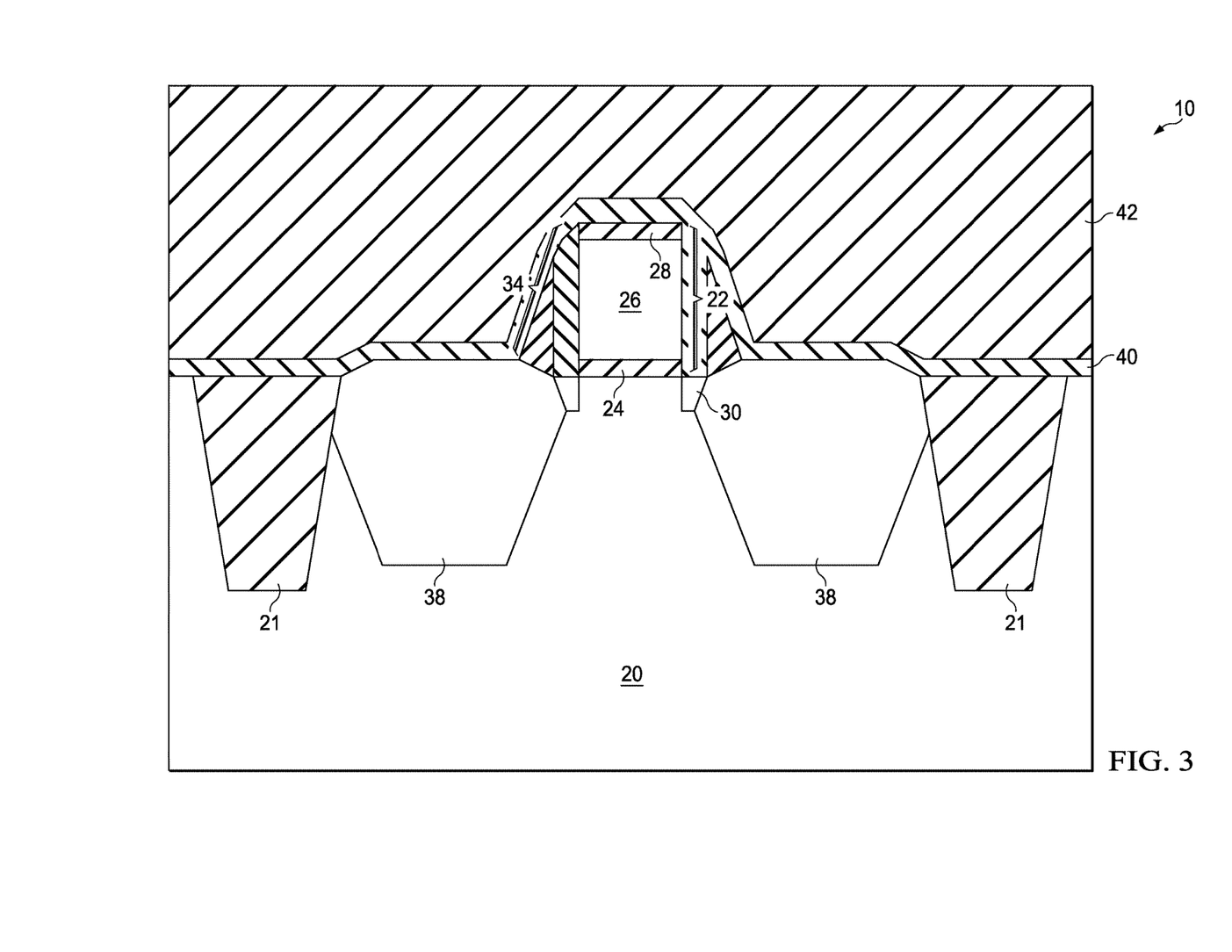

Referring to FIG. 3, Contact Etch Stop Layer (CESL) 40 is formed over gate stack 22 and source/drain regions 38. In some embodiments, CESL 40 comprises silicon nitride, silicon carbide, or other dielectric materials. Inter-Layer Dielectric (ILD) 42 is form over CESL 40. ILD 42 is blanket formed to a height higher than the top surface of dummy gate stack 22. ILD 42 may comprise Flowable oxide formed using, for example, Flowable Chemical Vapor Deposition (FCVD). ILD 42 may also be a spin-on glass formed using spin-on coating. For example, ILD 42 may comprise Phospho-Silicate Glass (PSG), Boro-Silicate Glass (BSG), Boron-Doped Phospho-Silicate Glass (BPSG), Tetraethyl Orthosilicate (TEOS) oxide, TiN, SiOC, or other low-k non-porous dielectric materials.

Figure 4:
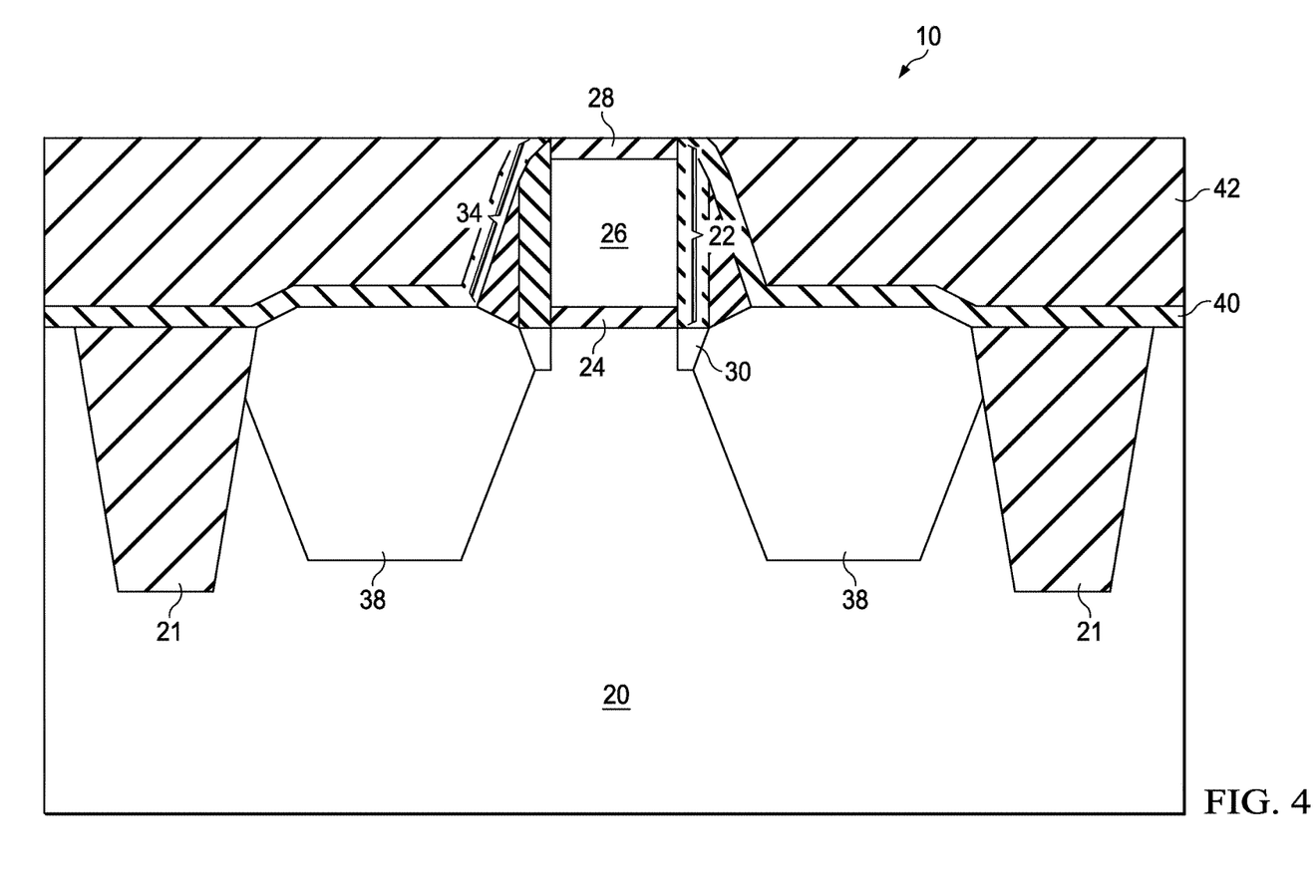

FIG. 4 illustrates a planarization step, which is performed using, for example, Chemical Mechanical Polish (CMP). The CMP is performed to remove excess portions of ILD 42 and CESL 40, wherein the excess portions are over the top surface of hard mask 28. Accordingly, dummy gate stack 22 is exposed. In alternative embodiments, hard mask 28 is removed during the CMP, wherein the CMP stops on the top surface of dummy gate electrode 26.

Figure 5:
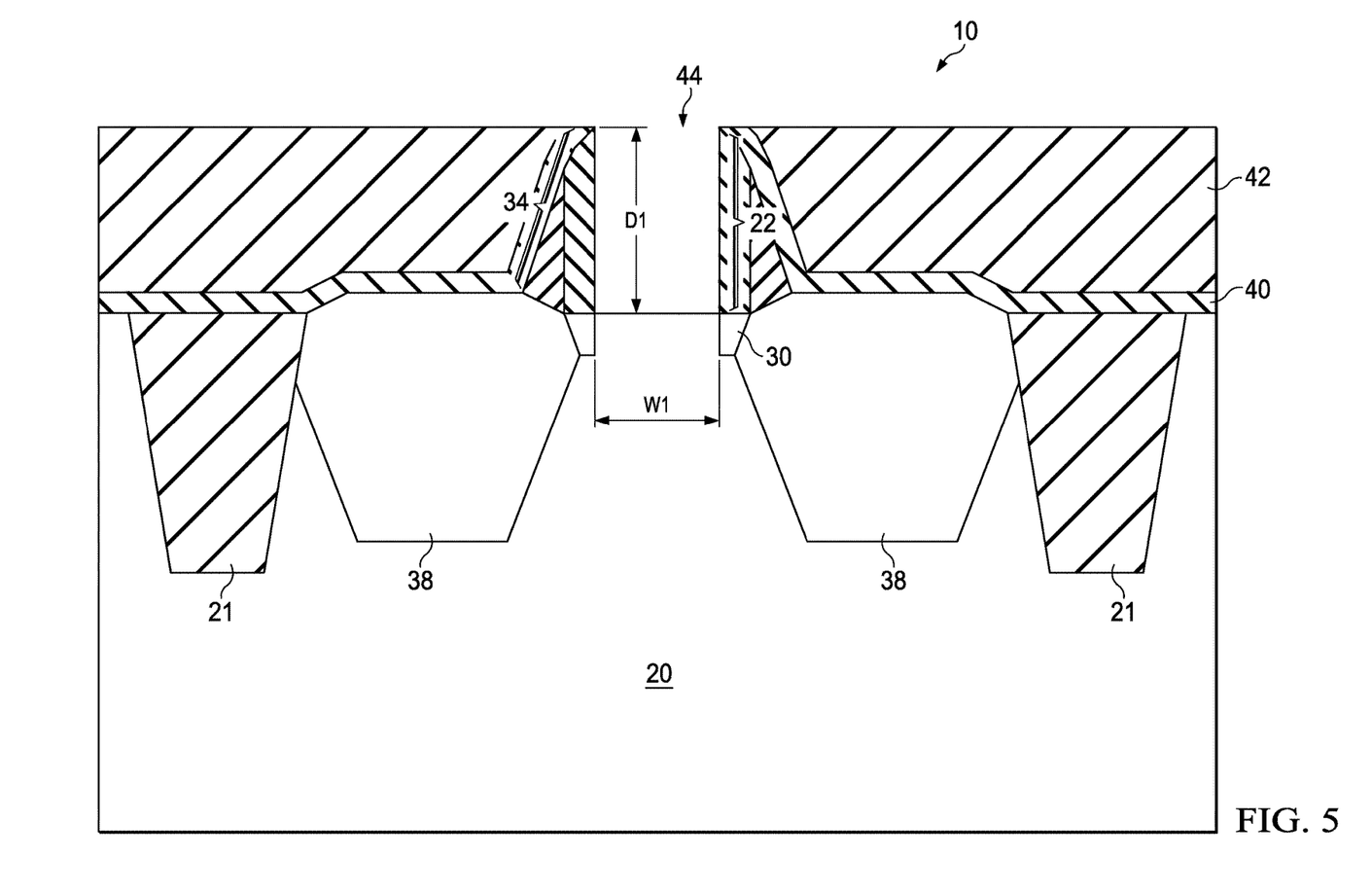

Next, dummy gate stack 22 is removed. Recess 44 is formed as a result of the removal of dummy gate stack 22, wherein the resulting structure is shown in FIG. 5. In some embodiment, the width W1 of recess 44 is smaller than about 25 nm, and may be in the range between about 18 nm and about 22 nm. It is appreciated, however, that the values recited throughout the description are merely examples, and may be changed to different values. Furthermore, depth D1 of recess 44 may be greater than about 40 nm. The aspect ratio D1/W1 of recess 44 may be higher than about 1.3, higher than about 7.0, or higher than about 10.0. Such high aspect ratio, small width W1, and great depth D1 demand the subsequently formed metal layers to be conformal in order to achieve the required performance.

Figure 6:
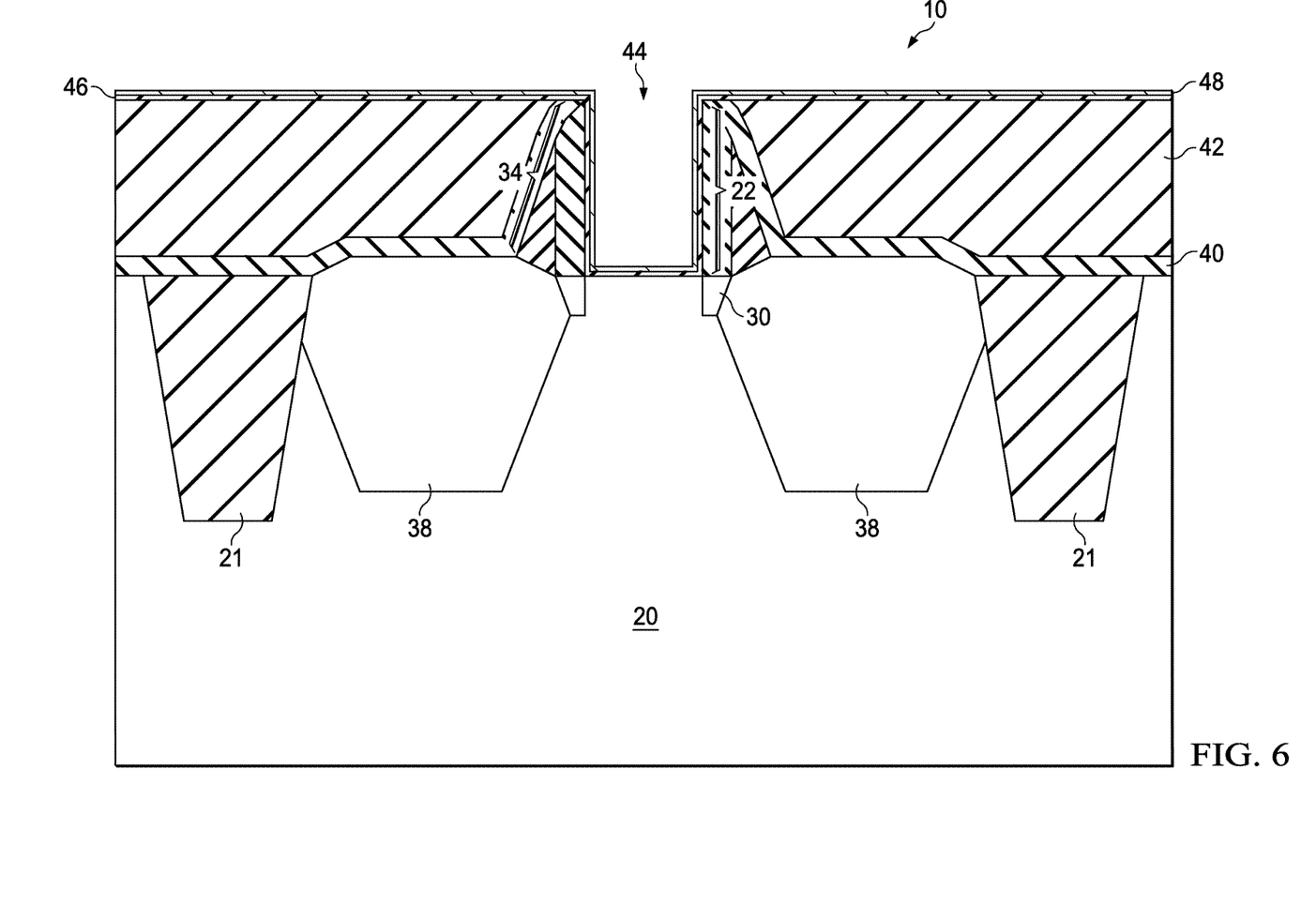

FIGS. 6 through 11 illustrate the formation of a replacement gate stack. Referring to FIG. 6, gate dielectric layer 46 is formed. In some embodiments, gate dielectric layer 46 includes an Interfacial Layer (IL, the lower part of gate dielectric layer 46), which is a dielectric layer. In some embodiments, the IL layer includes an oxide layer such as a silicon oxide layer, which may be formed through the thermal oxidation of substrate 20, a chemical oxidation, or a deposition step. Gate dielectric layer 46 may also include a high-k dielectric layer (the upper part of gate dielectric layer 46) comprising a high-k dielectric material such as hafnium oxide, lanthanum oxide, aluminum oxide, or the like. The dielectric constant (k-value) of the high-k dielectric material is higher than 3.9, and may be higher than about 7.0, and sometimes as high as 21.0 or higher. The high-k dielectric layer is overlying, and may contact, the interfacial dielectric.

As shown in FIG. 6, diffusion barrier layer 48 is formed over gate dielectric layer 46. In some embodiments, diffusion barrier layer 48 includes TiN, TaN, or composite layers thereof. For example, diffusion barrier layer 48 may include a TiN layer (the lower part of diffusion barrier layer 48), and a TaN layer (the upper part of diffusion barrier layer 48) over the TiN layer. The TiN layer may have a thickness lower than about 65 Å, and the TaN layer may have a thickness lower than about 20 Å.

Figure 7:
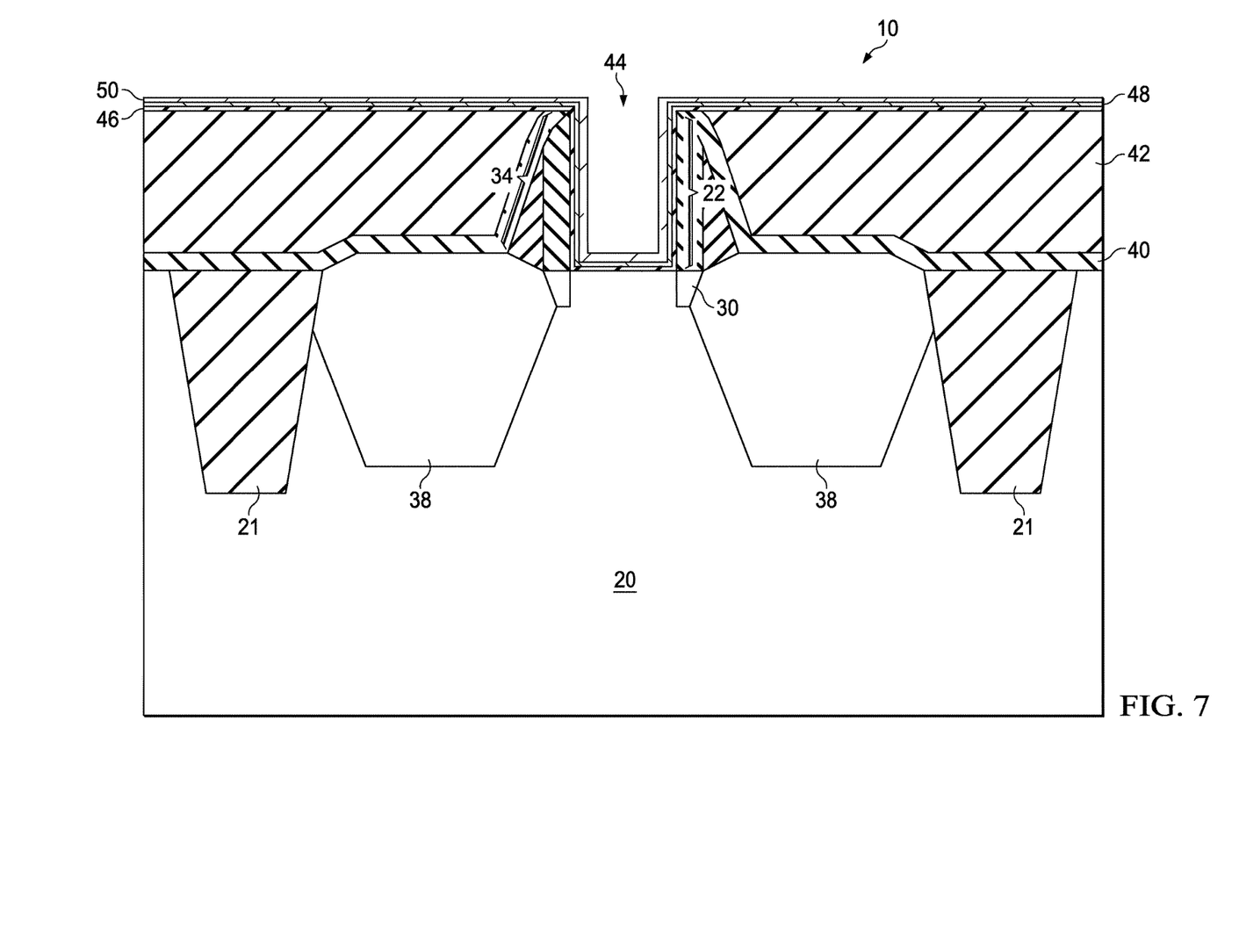

Referring to FIG. 7, metal layer 50 is formed. In the embodiments in which the resulting MOS device 100 (FIG. 12) is an N-type MOS (NMOS) device, metal layer 50 is in contact with diffusion barrier layer 48. For example, in the embodiments in which diffusion barrier layer 48 comprises a TiN layer and a TaN layer, metal layer 50 may be in physical contact with the TaN layer. In alternative embodiments in which the resulting MOS device 100 (FIG. 12) is a P-type MOS (PMOS) device, an additional TiN layer (not shown) is formed between, and in contact with, the TaN layer (in diffusion barrier layer 48) and the overlaying metal layer 50. The additional TiN layer provides the work function suitable for PMOS devices, which work function is higher than the mid-gap work function (about 4.5 eV) that is in the middle of the valance band and the conduction band of silicon. The work function higher than the mid-gap work function is referred to as a p-work function, and the respective metal having the p-work function is referred to as a p-metal.

Metal layer 50 provides the work function suitable for NMOS devices, which work function is lower than the mid-gap work function. The work function lower than the mid-gap work function is referred to as an n-work function, and the respective metal having the n-work function may be referred to as an n-metal. In some embodiments, metal layer 50 is an n-metal having a work function lower than about 4.3 eV. The work function of metal layer 50 may also be in the range between about 3.8 eV and about 4.6 eV. Metal layer 50 may comprise titanium aluminum (TiAl) (which may include, or free from or substantially free from other elements) in accordance with some embodiments. The formation of metal layer 50 may be achieved through Physical Vapor Deposition (PVD). In accordance with some embodiments of the present disclosure, metal layer 50 is formed at room temperature (for example, about 20° C. to about 25° C.). In alternative embodiments, metal layer 50 is formed at an elevated temperature higher than the room temperature, for example, higher than about 200° C.

Figure 8:
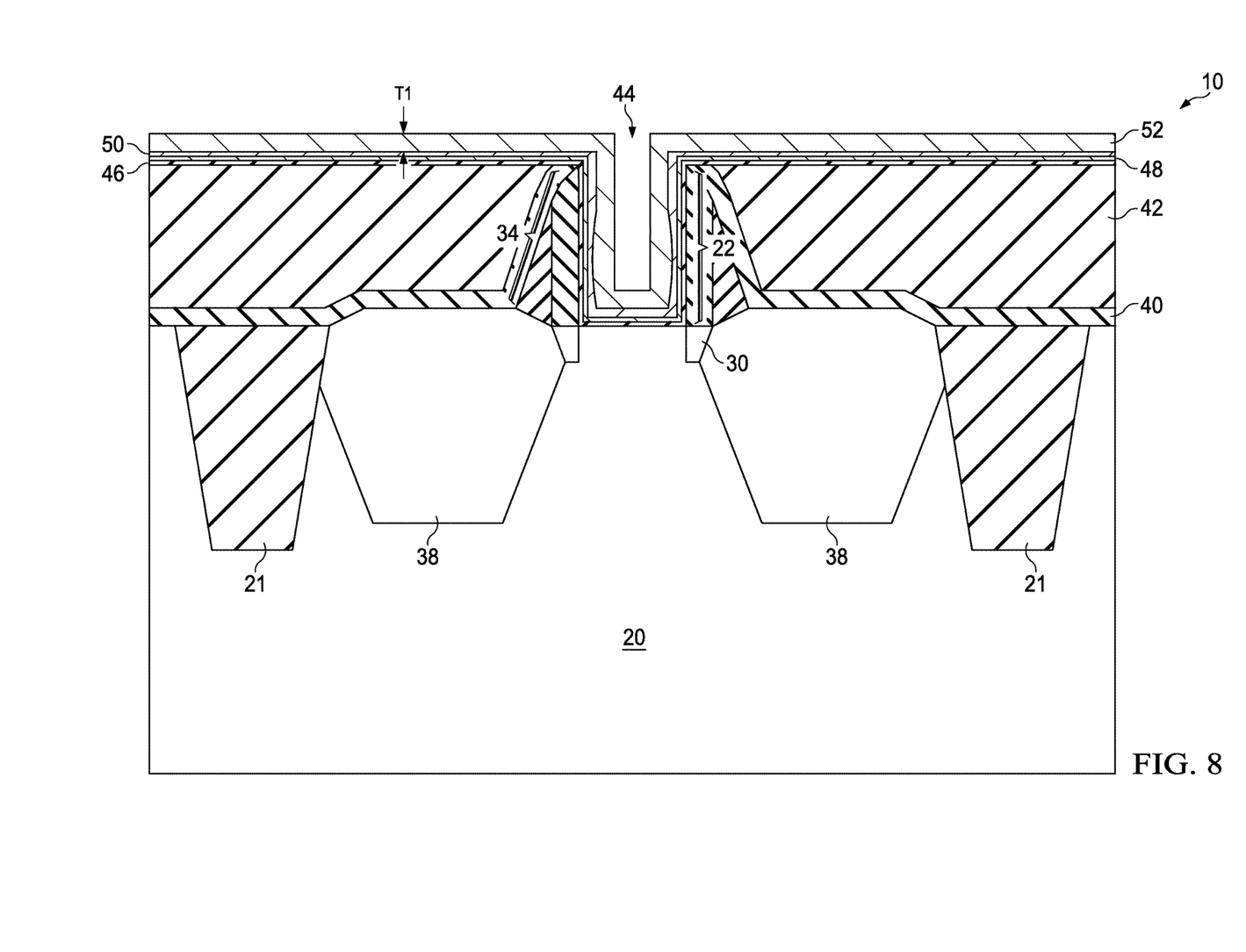

Next, as shown in FIG. 8, block layer 52 is formed. Block layer 52 includes a portion extending into recess 44, and may comprise cobalt tungsten (CoW) in some embodiments. Block layer 52 may be formed using Atomic Layer Deposition (ALD). The precursors for forming block layer 52 may comprise a cobalt-containing precursor and a tungsten-containing precursor. For example, the cobalt-containing precursor may comprise octacarbonyl dicobalt ($Co_2(CO)_8$), biscyclopentadienyl cobalt ($Cp_2Co$), Dicobalt Hexacarbonyl Butylacetylene (CCTBA), Cyclopentadienyl Cobalt Dicarbonyl (CPCOCO), with the chemical formula ($C_5H_5(CO)_2Co$), and/or the like. The tungsten-containing precursor may comprise $WF_6$, $W(CO)_6$, and/or the like. Furthermore, other precursors and carrier gases such as $N_2$, He, $H_2$, or combinations thereof, may also be used.

Since width W1 (FIG. 5) of recess 44 is small, and the formation of the replacement gate of the MOS device involves the formation of multiple layers, overhang may occur in one or more of the layers, resulting in the formation of void in the resulting replacement gate. The overhang is a portion that extends beyond underlying portions in the horizontal direction. In the embodiments of present disclosure, the use of ALD to form block layer 52 results in a highly conformal layer, and the occurrence of overhang is minimized or eliminated. Furthermore, CoW has a lower resistivity than other available materials (such as TiN) that have the function of blocking atoms on the opposite sides of the block layer to penetrate through. Accordingly, the performance of the resulting MOS device 100 (FIG. 12) is improved.

In some embodiments, block layer 52 has thickness T1 in the range between about 2 nm and about 7 nm. The atomic percentage of cobalt in metal layer 52 may be in the range between about 70 percent and about 90 percent. The atomic percentage of tungsten in metal layer 52 may be in the range between about 10 percent and about 30 percent.

Figure 9:
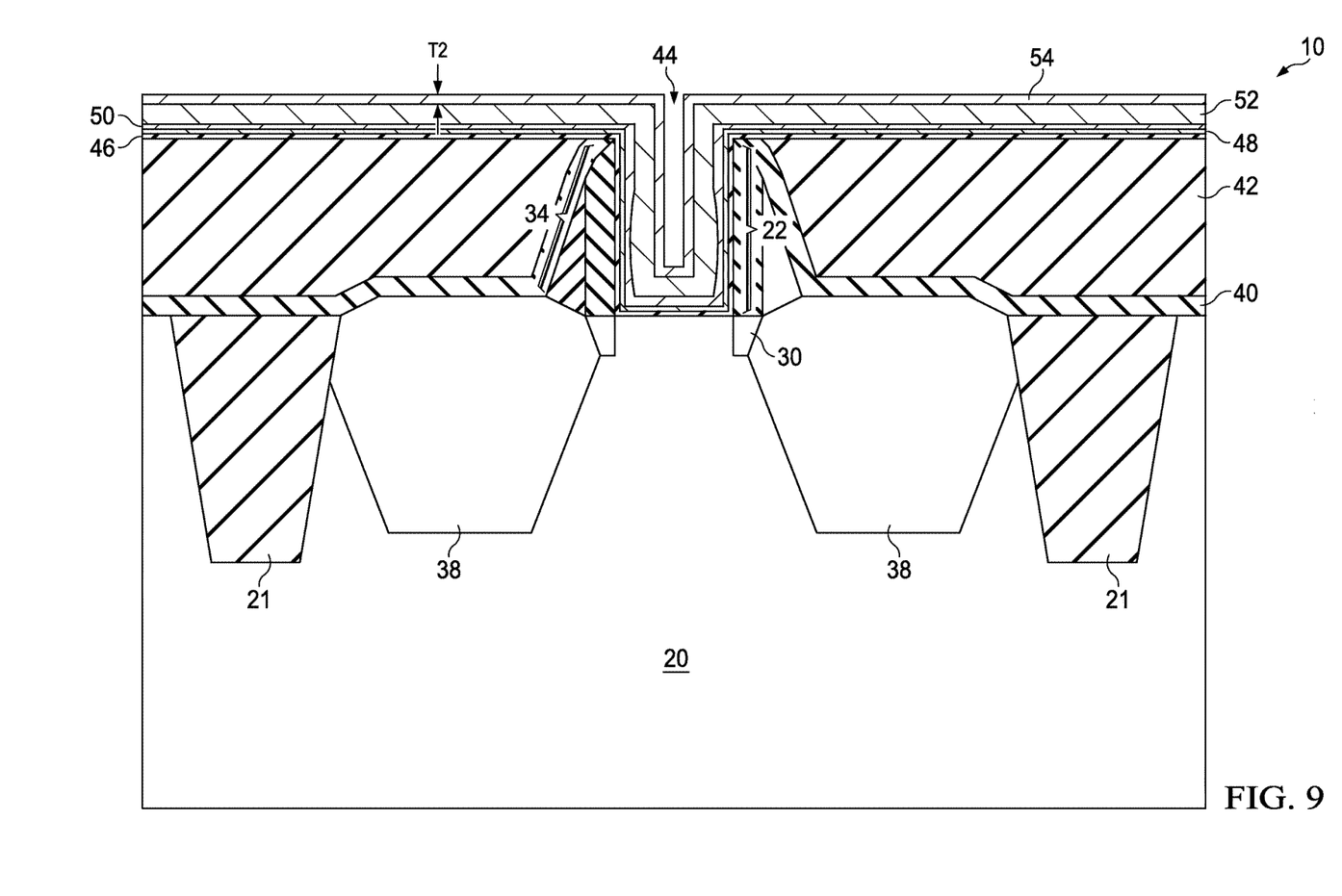

FIG. 9 illustrates the formation of wetting layer 54 (also referred to as metal layer 54), which has a good ability to adhere (and wet) the subsequently formed filling metal 56 (FIG. 12) during the reflow of filling metal 56. In some embodiments, wetting layer 54 is a cobalt layer, which may be formed using ALD. In accordance with some embodiments, wetting layer 54 is formed in situ with block layer 52 in the same ALD tool. In these embodiments, the process for forming block layer 52 is transitioned to the process for forming wetting layer 54 by turning off the tungsten-containing precursor such as $WF_6$, while the introduction of the cobalt-containing precursor is continued. There may not be any vacuum break between the formation of block layer 52 and the formation of wetting layer 54. In some embodiments, wetting layer 54 has thickness T2 in the range between about 1 nm and about 3 nm. The atomic percentage of cobalt in wetting layer 54 may be greater than about 90 percent, and may be in the range between about 70 percent and about 90 percent.

In alternative embodiments, wetting layer 54 is formed using Chemical Vapor Deposition (CVD). In these embodiments, a vacuum break may, or may not, occur between the formation of block layer 52 and the formation of wetting layer 54, so that wafer 10 can be transferred from the chamber for performing ALD to the chamber for performing the CVD.

FIG. 10 illustrates the formation of filling metal 56 to fill the remaining portions of recess 44 (FIG. 9). Filling metal 56 may comprise aluminum or an aluminum alloy, which may also be formed using PVD, CVD, or the like. Filling metal 56 may be reflowed to fully fill the remaining recess 44 as in FIG. 9. The formation of wetting layer 54 improves the wetting of filling metal 56 to the underlying layers.

Figure 11:
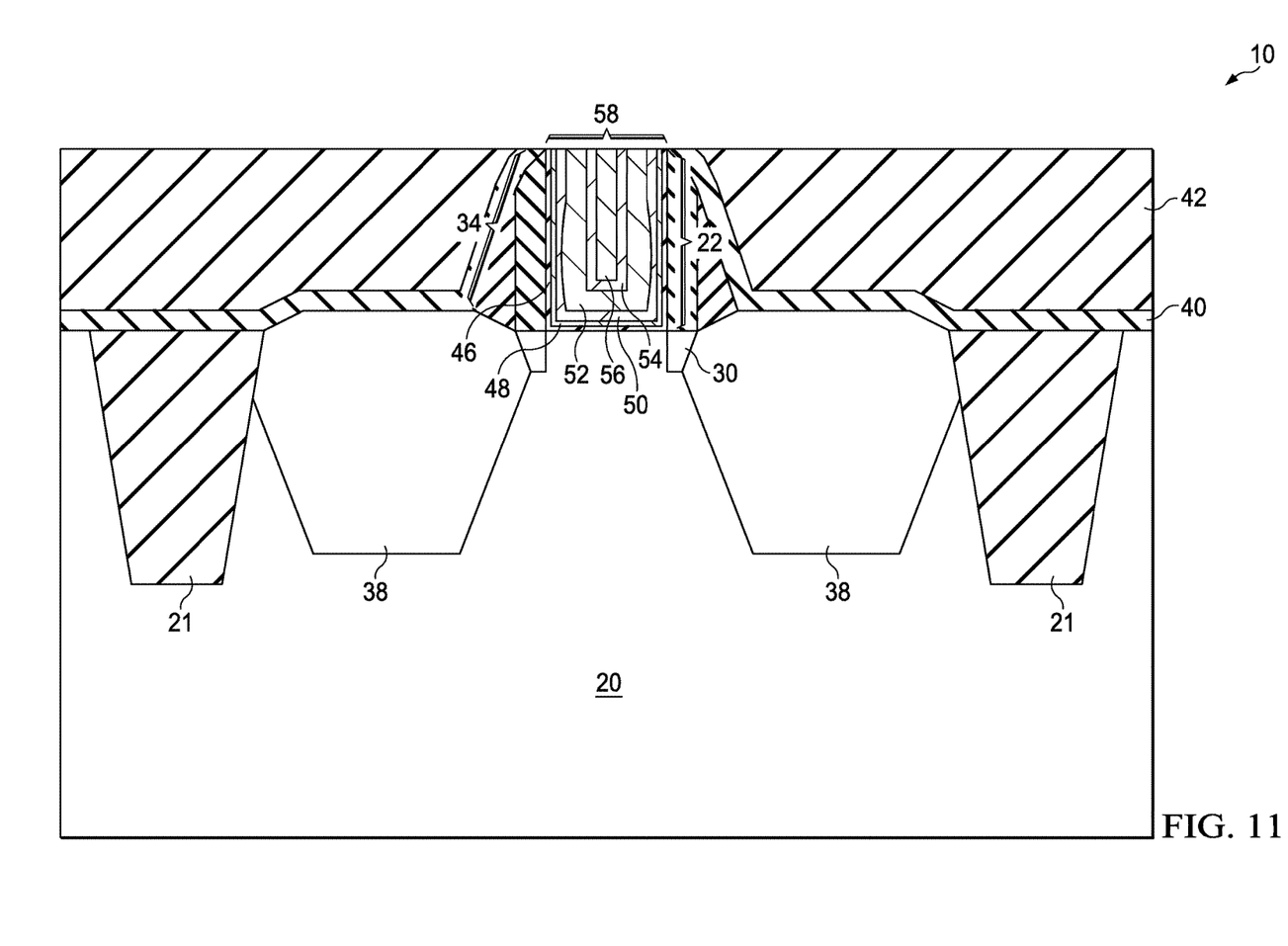

FIG. 11 illustrates a planarization step (for example, a CMP) for removing excess portions of layers 46, 48, 50, 52, 54, and 56, wherein the excess portions are over ILD 42. The remaining portions of layers 46, 48, 50, 52, 54, and 56 form replacement gate stack 58. Each of the remaining portions of layers 46, 48, 50, 52, 54, and 56 may include a bottom portion, and sidewall portions over and connected to the bottom portion.

Figure 12:
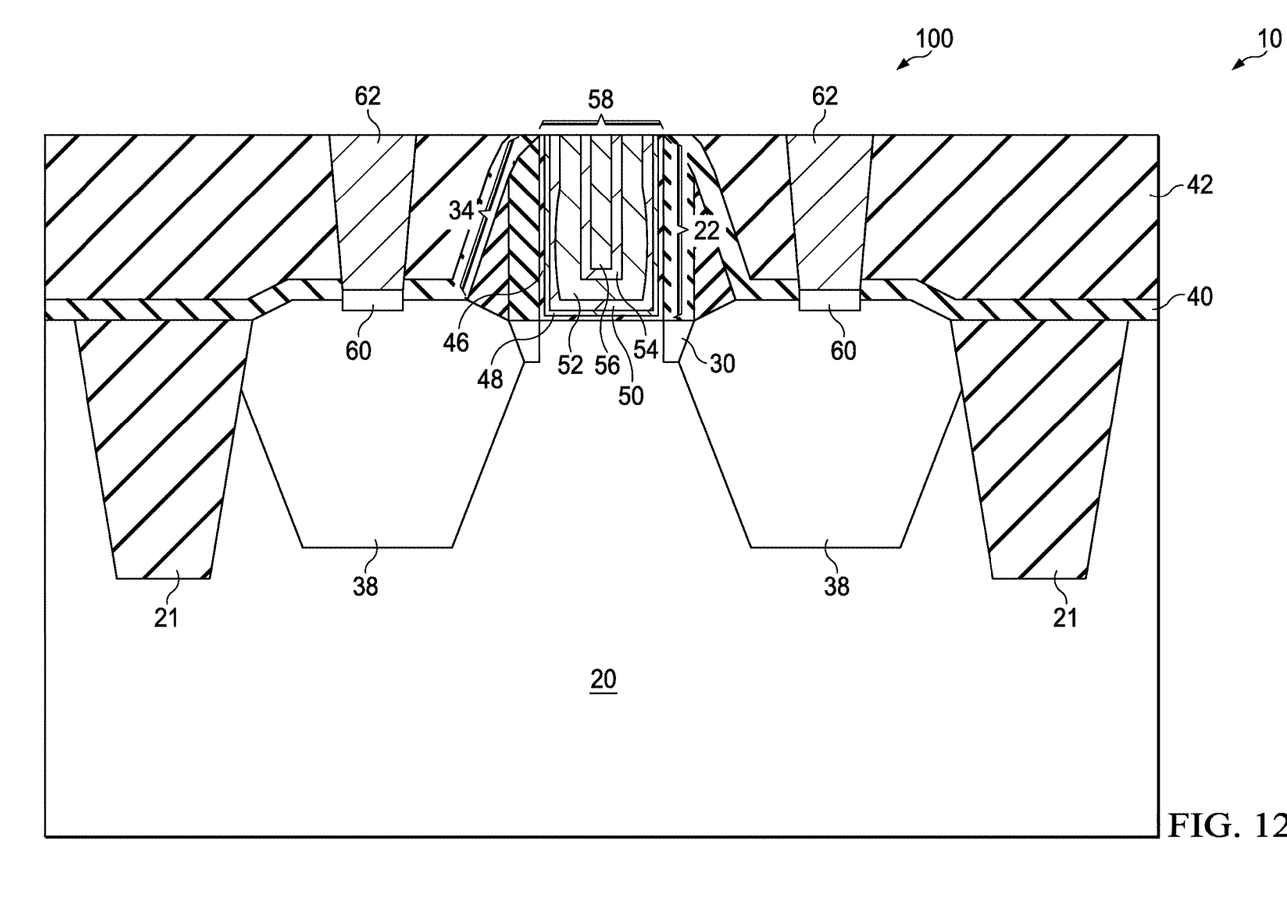

Referring to FIG. 12, source/drain silicide regions 60 and contact plugs 62 are formed. The formation process may include forming contact plug openings in ILD 42 to expose source/drain regions 38, forming a metal layer (not shown) to extend into the contact plug openings, performing an annealing to form the source/drain silicide regions 60, removing the un-reacted portions of the metal layer, and filling the contact plug openings to form contact plugs 62. MOS device 100 is thus formed.

The embodiments of the present disclosure have some advantageous features. By using the ALD to form the block layer in the metal gate, the conformity of the block layer is improved, and the overhang of the block layer is reduced or eliminated. Accordingly, the likelihood of having void formed in the metal gate is reduced. The CoW, which may be used to form the block layer, has a low resistivity, hence helps reduce the overall resistivity of the metal gate of the respective MOS device. In addition, by using the ALD, the block layer and the wetting layer may be formed using a same production tool and share same precursors, and hence the manufacturing process may be simplified.

In accordance with some embodiments of the present disclosure, a method includes forming a dummy gate stack over a semiconductor substrate, wherein the semiconductor substrate is comprised in a wafer, removing the dummy gate stack to form a recess, forming a gate dielectric layer in the recess, and forming a metal layer in the recess and over the gate dielectric layer. The metal layer has an n-work function. A block layer is deposited over the metal layer using Atomic Layer Deposition (ALD). The remaining portion of the recess is filled with metallic materials, wherein the metallic materials are overlying the metal layer.

In accordance with alternative embodiments of the present disclosure, a method includes forming a dummy gate stack over a semiconductor substrate, wherein the semiconductor substrate is in a wafer, removing the dummy gate stack to form a recess in an inter-layer dielectric layer, forming a gate dielectric layer in the recess, forming a titanium aluminum layer in the recess, forming a cobalt tungsten layer over the titanium aluminum layer, and forming a cobalt layer over the cobalt tungsten layer. The method further includes filling remaining portions of the recess with metallic materials, and performing a planarization to remove excess portions of the metallic materials, the cobalt layer, the cobalt tungsten layer, the titanium aluminum layer, and the gate dielectric layer.

In accordance with yet alternative embodiments of the present disclosure, an integrated circuit device includes a semiconductor substrate, an ILD layer over the semiconductor substrate, gate spacers in the ILD, and a replacement gate in the ILD and between opposite portions of the gate spacers. The replacement gate includes a gate dielectric layer, a titanium aluminum layer over the gate dielectric layer, a cobalt tungsten layer over the titanium aluminum layer, and a cobalt layer over the cobalt tungsten layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dummy gate stack over a semiconductor substrate, wherein the semiconductor substrate is comprised in a wafer;
   removing the dummy gate stack to form a recess;
   forming a gate dielectric layer in the recess;
   forming a metal layer in the recess and over the gate dielectric layer, wherein the metal layer has an n-work function, and the metal layer provides work function of a respective gate stack comprising the gate dielectric layer and the metal layer;
   forming a block layer over the metal layer using Atomic Layer Deposition (ALD); and
   filling a remaining portion of the recess with metallic materials, wherein the metallic materials are overlying the metal layer.

2. The method of claim 1, wherein the forming the metal layer comprises depositing a titanium aluminum (TiAl) layer, and wherein the forming the block layer comprises forming a Cobalt tungsten (CoW) layer.

3. The method of claim 1, wherein the block layer is in contact with the metal layer, and wherein the method further comprises forming a cobalt layer over and contacting the block layer.

4. The method of claim 3, wherein the forming the cobalt layer is performed using ALD.

5. The method of claim 3, wherein the forming the block layer is performed using precursors comprising:
   a cobalt-containing precursor; and
   a tungsten-containing precursor, wherein the forming the cobalt layer is performed in situ with the block layer in a same production tool, and wherein the forming the cobalt layer comprises:
      turning off the tungsten-containing precursor; and
      continuing conducting the cobalt-containing precursor into the same production tool.

6. The method of claim 1, wherein the filling the remaining portion of the recess with the metallic materials comprises depositing an aluminum layer over the block layer.

7. The method of claim 1 further comprising, after the forming the gate dielectric layer and before the forming the metal layer:
   forming a titanium nitride layer over the gate dielectric layer;
   forming a tantalum nitride layer over the titanium nitride layer; and
   forming an additional titanium nitride layer over the tantalum nitride layer.

8. A method comprising:
   forming a dummy gate stack over a semiconductor substrate, wherein the semiconductor substrate is comprised in a wafer;
   removing the dummy gate stack to form a recess in an inter-layer dielectric;
   forming a gate dielectric layer in the recess;
   forming a titanium aluminum layer in the recess;
   forming a cobalt tungsten layer over the titanium aluminum layer;
   forming a cobalt layer over the cobalt tungsten layer, the cobalt tungsten layer being interposed between the cobalt layer and the titanium aluminum layer;
   filling remaining portions of the recess with metallic materials; and
   performing a planarization to remove excess portions of the metallic materials, the cobalt layer, the cobalt tungsten layer, the titanium aluminum layer, and the gate dielectric layer, with the excess portions being over the recess.

9. The method of claim 8, wherein the forming the cobalt tungsten layer comprises an atomic layer deposition.

10. The method of claim 8, wherein the forming the cobalt layer comprises an atomic layer deposition.

11. The method of claim 8, wherein the forming the cobalt tungsten layer comprises an atomic layer deposition using precursors comprising:
    a cobalt-containing precursor; and
    a tungsten-containing precursor, wherein the forming the cobalt layer is performed in situ with the cobalt tungsten layer in a same production tool, and wherein the forming the cobalt layer comprises the atomic layer deposition, and comprises:
       turning off the tungsten-containing precursor; and
       continuing conducting the cobalt-containing precursor into the same production tool.

12. The method of claim 8, wherein the cobalt tungsten layer is in contact with the titanium aluminum layer, and wherein the cobalt layer is in contact with the cobalt tungsten layer.

13. The method of claim 8 further comprising:
    forming a contact etch stop layer overlying the dummy gate stack;
    forming the inter-layer dielectric over the contact etch stop layer; and
    performing a planarization to remove excess portions of the contact etch stop layer and the inter-layer dielectric, wherein the excess portions are over the dummy gate stack.

14. The method of claim 8, wherein the filling the remaining portions of the recess with the metallic materials comprises forming an aluminum layer over the cobalt layer.

15. The method of claim 8 further comprising, after the forming the gate dielectric layer and before the forming the titanium aluminum layer:
    forming a titanium nitride layer over the gate dielectric layer;
    forming a tantalum nitride layer over the titanium nitride layer; and
    forming an additional titanium nitride layer over the tantalum nitride layer.

16. A method comprising:
    removing a dummy gate stack to form a recess in an inter-layer dielectric, wherein a semiconductor fin is exposed, and is located in the recess;
    forming a gate dielectric layer on a top surface and a sidewall of the semiconductor fin;
    depositing a titanium aluminum layer over the gate dielectric layer;
    depositing a cobalt tungsten layer over and contacting the titanium aluminum layer using Atomic Layer Deposition (ALD);
    depositing a cobalt layer over and contacting the cobalt tungsten layer using ALD, the cobalt tungsten layer being interposed between the cobalt layer and the titanium aluminum layer;
    filling remaining portions of the recess with metallic materials; and performing a planarization on the metallic materials, the cobalt layer, the cobalt tungsten layer, the titanium aluminum layer, and the gate dielectric layer.

17. The method of claim 16, wherein the cobalt tungsten layer is formed using precursors comprising:
   a cobalt-containing precursor; and
   a tungsten-containing precursor, wherein the forming the cobalt layer is performed in situ with the cobalt tungsten layer in a same production tool, and the cobalt layer is formed by:
      turning off the tungsten-containing precursor; and
      continuing conducting the cobalt-containing precursor into the same production tool.

18. The method of claim 16 further comprising:
   forming a contact etch stop layer overlying the dummy gate stack;
   forming the inter-layer dielectric over the contact etch stop layer; and
   performing a planarization to remove excess portions of the contact etch stop layer and the inter-layer dielectric, wherein the excess portions are over the dummy gate stack.

19. The method of claim 16, wherein the filling the remaining portions of the recess with the metallic materials comprises forming an aluminum layer over the cobalt layer.

20. The method of claim 16 further comprising, after the forming the gate dielectric layer and before the depositing the titanium aluminum layer:
   forming a titanium nitride layer over the gate dielectric layer; and
   forming a tantalum nitride layer over the titanium nitride layer.

* * * * *